(12) United States Patent
Song et al.

(10) Patent No.: US 8,829,891 B2
(45) Date of Patent: Sep. 9, 2014

(54) DIGITAL MULTIMETER

(75) Inventors: Yong-Jun Song, Shenzhen (CN);
Chun-Fang Xi, Shenzhen (CN)

(73) Assignees: Hong Fu Jin Precision Industry (ShenZhen) Co., Ltd., Shenzhen (CN);
Hon Hai Precisison Industry Co., Ltd., New Taipei (TW)

( * ) Notice: Subject to any disclaimer, the term of this patent is extended or adjusted under 35 U.S.C. 154(b) by 268 days.

(21) Appl. No.: 13/246,992

(22) Filed: Sep. 28, 2011

(65) Prior Publication Data
US 2012/0299581 A1 Nov. 29, 2012

(51) Int. Cl.
*G01R 1/00* (2006.01)
*G01R 29/00* (2006.01)
*G01R 15/00* (2006.01)
*G01R 15/12* (2006.01)

(52) U.S. Cl.
CPC .................................. *G01R 15/125* (2013.01)
USPC ........................................ 324/114; 324/115

(58) Field of Classification Search
CPC .............................. G01R 15/12; G01R 15/125
USPC .................................................. 324/115, 114
See application file for complete search history.

(56) References Cited

U.S. PATENT DOCUMENTS

| 4,949,274 | A | * | 8/1990 | Hollander et al. | 324/142 |
| 5,181,521 | A | * | 1/1993 | Lemelson | 600/549 |
| 5,938,593 | A | * | 8/1999 | Ouellette | 600/300 |
| 6,130,624 | A | * | 10/2000 | Guyer | 340/12.55 |
| 2004/0225503 | A1 | * | 11/2004 | Hollander et al. | 704/270 |

* cited by examiner

*Primary Examiner* — Jermele M Hollington
*Assistant Examiner* — Hoang X Nguyen
(74) *Attorney, Agent, or Firm* — Novak Druce Connolly Bove + Quigg LLP

(57) ABSTRACT

A digital multimeter includes a single chip processor, a sound chip connected to the single chip processor, a signal amplifying circuit, a speaker connected to the signal amplifying circuit, and a power source for providing electrical energy for the digital multimeter. The single chip processor collects high and low level signals, and converts the signals into codes which the sound chip can recognize, and transmits the codes to the sound chip. The sound chip converts the codes into audio signals and transmits the audio signals to the signal amplifying circuit. The signal amplifying circuit amplifies the audio signals and outputs the amplified audio signals to the speaker. The amplified audio signals reports the measurement values of the digital multimeter.

12 Claims, 5 Drawing Sheets

DIGITAL MULTIMETER

BACKGROUND

1. Technical Field

The present disclosure relates to digital multimeters, and particularly to a digital multimeter capable of reporting measurement values.

2. Description of Related Art

As measuring instruments in electronic technologies, digital multimeters are widely used to measure amperage, resistance, voltage, etc. Digital multimeters have the advantages of displaying measurement values directly and precisely. However, in practice, after two detecting pins of the digital multimeter are used to contact electrical nodes on a circuit board, the operator has to be able to read the measurement values on the display screen.

What is needed, therefore, is a digital multimeter which can overcome the limitations described.

DETAILED DESCRIPTION

Figure 1:
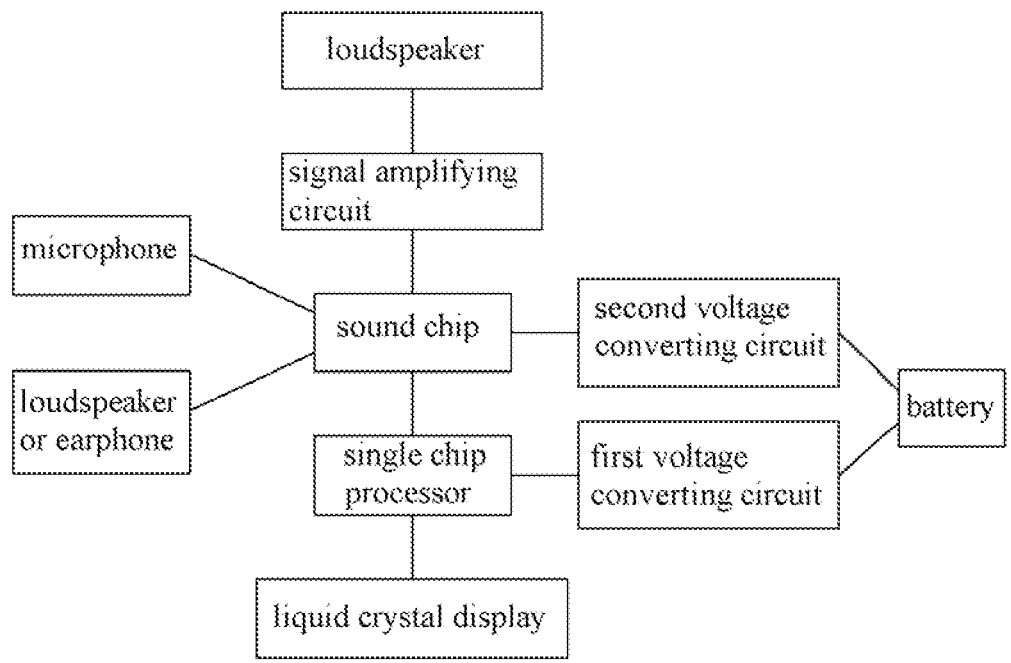
FIG. 1 is a block diagram of a digital multimeter in accordance with an exemplary embodiment of the disclosure.
Figure 2:
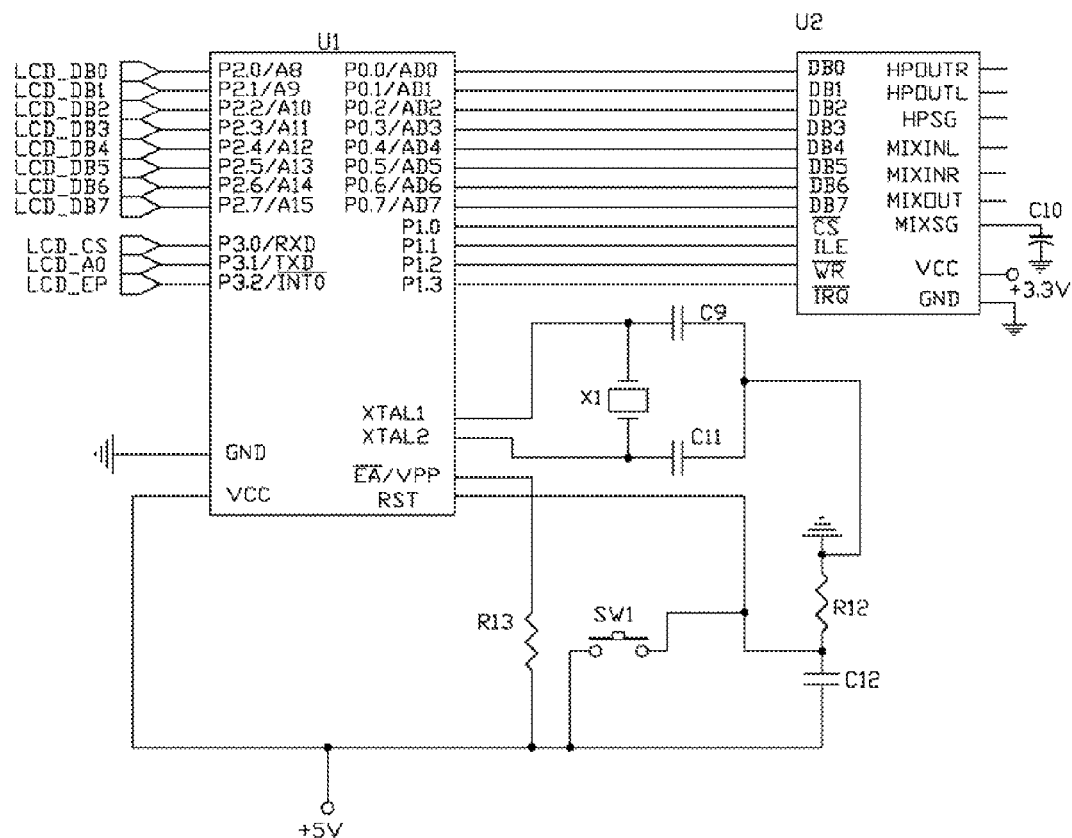
FIGS. 2-5 each show a different part of the circuit of the digital multimeter of FIG. 1.

Referring to FIGS. 1 and 2, a digital multimeter according to an exemplary embodiment of the disclosure includes a single chip processor U1, a sound chip U2, a signal amplifying circuit, a speaker LS, and a battery providing power for the digital multimeter.

In this embodiment, the type of the single chip processor U1 is AT89C51, and includes an input/output port P2 which includes eight pins P2.0-P2.7, and an input/output port P0 which includes eight pins P0.0-P0.7. The parallel input/output port P2 (i.e. Pins P2.0-P2.7) of the single chip processor U1 correspondingly connect to the signal pins LCD_DB0-LCD_DB7 of a liquid crystal display (LCD) of the digital multimeter to collect the measurement values of the digital multimeter. The high and low level signals collected are converted into codes via the programs in the single chip processor U1. The codes are then transmitted to the sound chip U2. A pin RXD of the single chip processor U1 connects to a pin LCD_CS of the LCD. A pin TXD of the single chip processor U1 connects to a pin LCD_A0 of the LCD. A pin INT0 of the single chip processor U1 connects to a pin LCD_EP of the LCD. A pin GND of the single chip processor U1 connects to ground. A pin VCC of the single chip processor U1 connects to a 5-volt direct current power source. A resistor R13 is connected between the power source and a pin VPP of the single chip processor U1, the resistor R13 is 1 kiloohm. A button SW1 is connected between the power source and a pin RST of the single chip processor U1. A capacitor C12 and a resistor R12 are connected in series between ground and the power source. The capacitor C12 is 10 microfarads, and the resistor R12 is 1 kiloohm. A crystal oscillator X1 is connected between a pin XTAL1 and a pin XTAL2 of the single chip processor U1. The frequency of the crystal oscillator X1 is 11 mhz. One end of a capacitor C9 and one end of a capacitor C11 are connected to the two ends of the crystal oscillator X1. The other end of the capacitor C9 and the other end of the capacitor C11 are connected to ground. Each of the capacitor C9 and the capacitor C11 is 22 picofarads.

The type of the sound chip U2 is ML2860. Data pins DB0-DB7 of the sound chip U2 correspondingly connect with the parallel input/output port P0 (i.e. Pins P0.0-P0.7) of the single chip processor U1 to receive the codes from the single chip processor U1. The sound chip U2 converts the codes into various audio frequency analog signals and transmits the audio frequency analog signals to the signal amplifying circuit via a pin MIXOUT of the sound chip U2. A pin CS of the sound chip U2 connects to a pin P1.0 of the single chip processor U1. A pin ILE of the sound chip U2 connects to a pin P1.1 of the single chip processor U1. A pin WR of the sound chip U2 connects to a pin P1.2 of the single chip processor U1. A pin IQR of the sound chip U2 connects to a pin P1.3 of the single chip processor U1. A pin GND of the sound chip U2 connects to ground. A pin VCC of the sound chip U2 connects to a 3.3-volt direct current power source. A capacitor C10 is connected between a pin MIXSG of the sound chip U2 and ground, the capacitor C10 is 10 microfarads.

Figure 3:
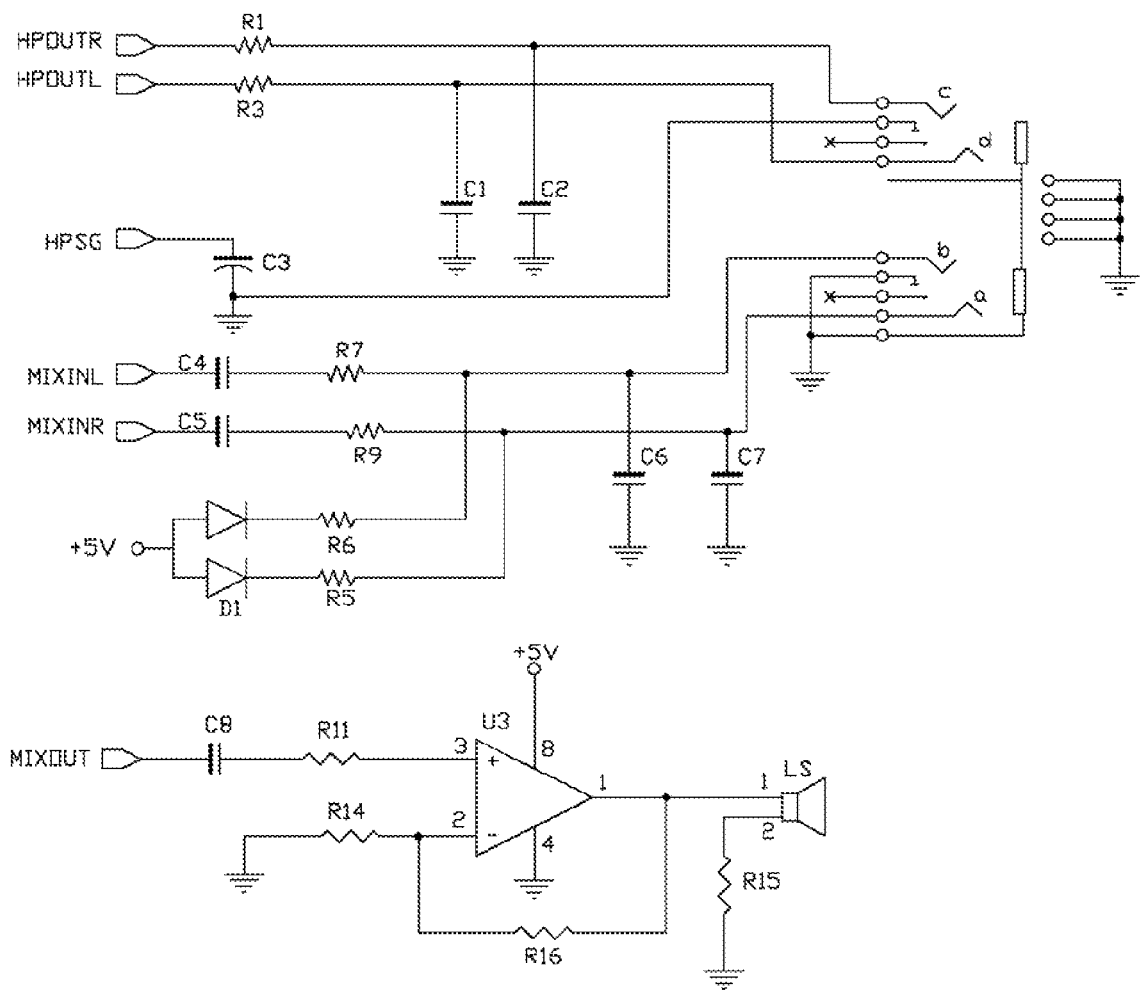

Also referring to FIG. 3, a capacitor C5, a resistor R9 and a capacitor C7 are connected in series between a pin MIXINR of the sound chip U2 and ground. The capacitor C5 is 4.7 microfarads, the capacitor C7 is 470 picofarads, and the resistor R9 is 1 kiloohm. A capacitor C4, a resistor R7 and a capacitor C6 are connected in series between a pin MIXINL of the sound chip U2 and ground. The capacitor C4 is 4.7 microfarads, the capacitor C6 is 470 picofarads, and the resistor R7 is 1 kiloohm. A port "a" is formed between the resistor R9 and the capacitor C7, and a port "b" is formed between the resistor R7 and the capacitor C6. The port "a" and the port "b" cooperatively form an interface for connecting a microphone. One end of the resistor R5 is connected to the port "a". One end of the resistor R6 is connected to the port "b". The other ends of the resistors R5 and R6 connect to two cathodes of a diode D1. The two anodes of the diode D1 connect to the power source. Each of the resistors R5 and R6 is 4.7 kiloohms. One end of a resistor R1 connects to a pin HPOUTR of the sound chip U2. One end of a capacitor C2 connects to ground. The resistor R1 and the capacitor C2 are connected in series. The resistor R1 is 91 ohms, the capacitor C2 is 470 picofarads. One end of a resistor R3 connects to a pin HPOUTL of the sound chip U2. One end of a capacitor C1 connects to ground. The resistor R3 and the capacitor C1 are connected in series. The resistor R3 is 91 ohms, the capacitor C1 is 470 picofarads. A port "c" is formed between the resistor R1 and the capacitor C2, and a port "d" is formed between the resistor R3 and the capacitor C1. The port "c" and the port "d" cooperatively form an interface for connecting a speaker or an earphone. A capacitor C3 is connected between a pin HPSG of the sound chip U2 and ground, the capacitor C3 is 10 microfarads.

The audio frequency analog signals outputted by the sound chip U2 are very weak and need to be amplified via the signal amplifying circuit. The signal amplifying circuit includes an operational amplifier U3. Pins 4 and 8 of the operational amplifier U3 respectively connect to ground and the power source. A capacitor C8 and a resistor R11 are connected in series, and are located between a non-inverting input 3 of the operational amplifier U3 and the pin MIXOUT of the sound chip U2. The capacitor C8 is 4.7 microfarads, the resistor R11 is 10 kiloohms A resistor R14 is connected between an inverting input 2 of the operational amplifier U3 and ground, the resistor R14 is 1 kiloohm. A resistor R16 is connected between the inverting input 2 and an output 1 of the operational amplifier U3, the resistor R16 is 20 kiloohms. The output 1 of the operational amplifier U3 connects to a pin 1 of the speaker LS to output the amplified audio frequency analog signals to the speaker LS. The amplified audio frequency analog signals drive the speaker LS. A resistor R15 is connected between a pin 2 of the speaker LS and ground, the resistor R15 is 1 kiloohm.

Figure 4:
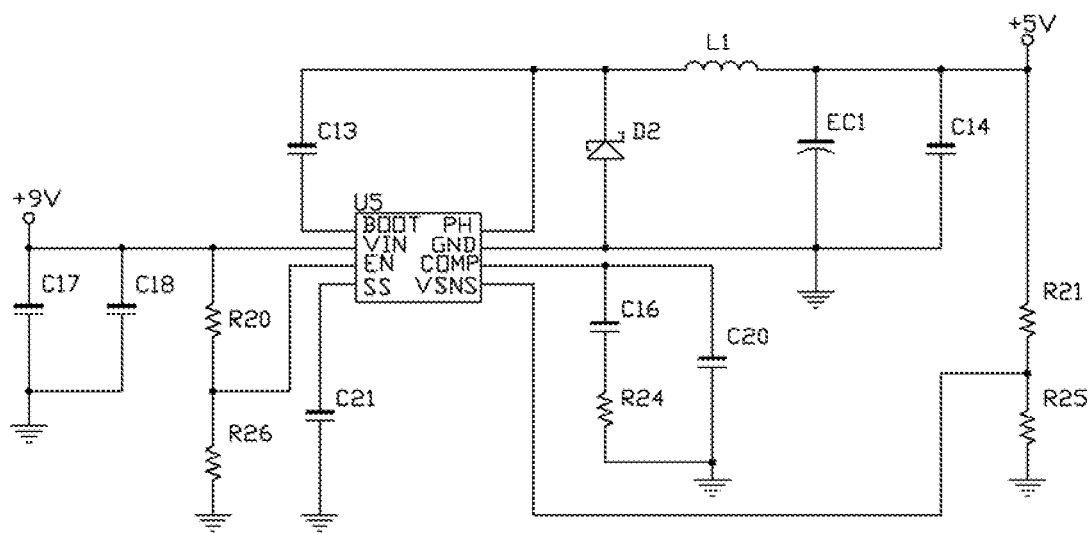

Also referring to FIG. 4, since the working voltage of the digital multimeter may be 9 volts and the working voltage of the single chip processor U1 may be 5 volts, a first voltage converting circuit shown in FIG. 4 is needed to convert the 9 volts into 5 volts to provide suitable power for the single chip processor U1. The first voltage converting circuit includes a converting chip U5, the type of the converting chip U5 is SN0907035D. A pin VIN of the converting chip U5 connects to the 9-volt direct current power source. A capacitor C17 and a capacitor C18 are connected in parallel, and are located between the 9-volt direct current power source and ground. Each of the capacitors C17 and C18 is 10 microfarads. The resistors R20 and R26 are connected in series, and are located between the 9-volt direct current power source and ground. A pin EN of the converting chip U5 connects to a node between the resistors R20 and R26. The resistor R20 is 100 kiloohms, the resistor R26 is 12.7 kiloohms A capacitor C21 is connected between a pin SS of the converting chip U5 and ground, the capacitor C21 is 10 microfarads. The resistors R21 and R25 are connected in series, and are located between the 5-volt direct current power source and ground. A pin VSNS of the converting chip U5 connects to a node between the resistors R21 and R25. The resistor R21 is 8.2 kiloohms, the resistor R25 is 1.57 kiloohms A capacitor C20 is connected between a pin COMP of the converting chip U5 and ground. A capacitor C16 and a resistor R24 are connected in series, and are located between the pin COMP of the converting chip U5 and ground. The capacitor C16 is 820 picofarads, and the capacitor C20 is 27 picofarads. A pin GND of the converting chip U5 connects to ground. An inductance L1 is connected between a pin PH of the converting chip U5 and the 5-volt direct current power source. The inductance L1 is 10 microhenries. The inductance L1 and a capacitor C13 are connected in series, and are located between a pin BOOT of the converting chip U5 and the 5-volt direct current power source. The capacitor C13 is 0.1 microfarads. The inductance L1 and a Schottky diode D2 are connected in series, and are located between the 5-volt direct current power source and ground. The cathode of the Schottky diode D2 connects to the inductance L1. The anode of the Schottky diode D2 connects to ground. The capacitors EC1 and C14 are connected in parallel, and located between the 5-volt direct current power source and ground. The capacitor EC1 is 100 microfarads, the capacitor C14 is 0.1 microfarads.

Figure 5:
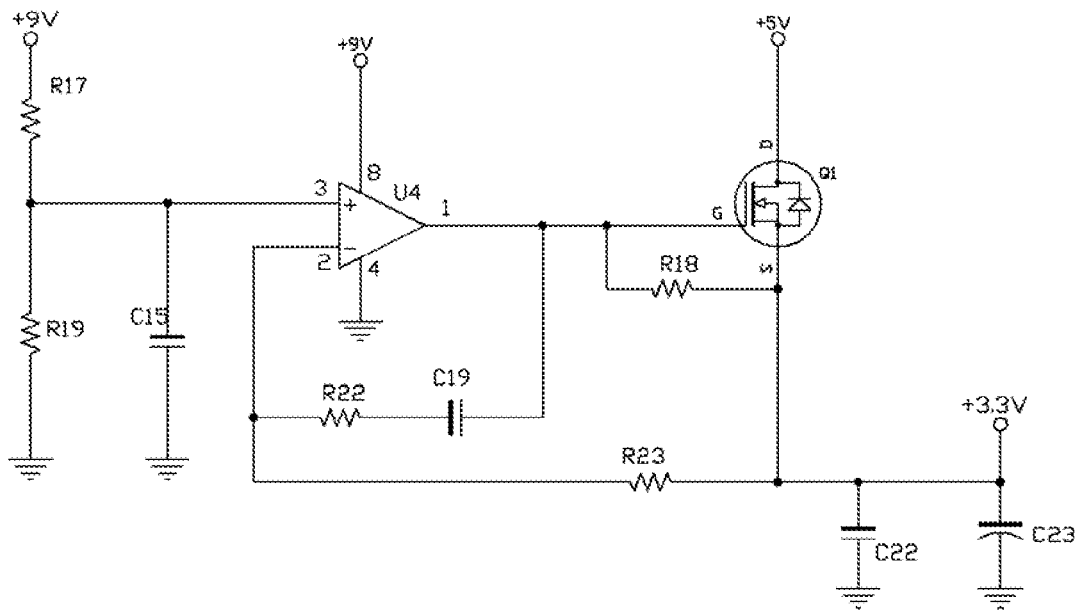

Also referring to FIG. 5, since the working voltage of the digital multimeter may be 9 volts, and the working voltage of the sound chip U2 may be 3.3 volts, a second voltage converting circuit (shown in FIG. 5) is needed to convert the 9 volts voltage into the 3.3 volts voltage to provide power for the sound chip U2. In the second voltage converting circuit, resistors R17 and R19 are connected in series, and are located between the 9-volt direct current power source and ground. The resistor R17 is 2.15 kiloohms, the resistor R19 is 1.25 kiloohms. The voltage of a node between the resistors R17 and R19 is 3.3 volts. A non-inverting input 3 of an operational amplifier U4 connects to the node between the resistors R17 and R19. A capacitor C15 is connected between the non-inverting input 3 of the operational amplifier U4 and ground. The capacitor C15 is 0.1 microfarads. Pins 4 and 8 of the operational amplifier U4 respectively connect to ground and to the 9-volt direct current power source. The gate electrode G of a MOSFET Q1 connects to an output 1 of the operational amplifier U4. The drain electrode D of the MOSFET Q1 connects to the 5-volt direct current power source. A capacitor C19 is connected between an out-of-phase input end 2 and the output 1 of the operational amplifier U4. The capacitor C19 is 1 nanofarad. A resistor R18 is connected between the gate electrode G and the source electrode S of the MOSFET Q1. The resistor R18 is 1 kiloohm. A resistor R23 is connected between the inverting input 2 of the operational amplifier U4 and the source electrode S of the MOSFET Q1. The resistor R23 is 2.2 kiloohms. The source electrode S of the MOSFET Q1 connects to a 3.3-volt direct current power source. A capacitor C22 and a capacitor C23 are connected in parallel, and are located between the 3.3-volt direct current power source and ground. The capacitor C22 is 4.7 microfarads, the capacitor C23 is 470 microfarads.

According to the disclosure, since the digital multimeter can report the measurement values through the speaker, an operator does not have to pay attention to the screen of the digital multimeter to read the measurement values when measuring. Thus, this multimeter can be used in additional situations where it cannot be positioned in such a way as to allow its screen to be (easily) read, and working efficiency is improved.

Even though numerous characteristics and advantages of the disclosure have been set forth in the foregoing description, together with details of the structure and function of the embodiments, the disclosure is illustrative only, and changes may be made in detail, especially in matters of shape, size, and the arrangement of parts within the principles of the invention to the full extent indicated by the broad general meaning of the terms in which the appended claims are expressed.

What is claimed is:

1. A digital multimeter comprising:
   a single chip processor
   a sound chip connected to the single chip processor;
   a signal amplifying circuit;
   a speaker connected to the signal amplifying circuit;
   a battery for providing electrical energy for the digital multimeter; and
   an interface for connecting a microphone, the interface connected to the sound chip;
   wherein a first capacitor, a first resistor and a second capacitor are connected in series between a first pin of the sound chip and ground, a third capacitor, a second resistor and a fourth capacitor being connected in series between a second pin of the sound chip and ground, a first port being formed between the first resistor and the second capacitor, a second port being formed between the second resistor and the fourth capacitor, the first port and the second port cooperatively forming the interface for connecting a microphone, one end of a third resistor being connected to the first port, one end of the fourth resistor being connected to the second port, the other ends of the third and fourth resistors being connected to two cathodes of two diodes, two anodes of the diodes being connected to a first direct current power source;
   wherein the single chip processor collects high and low level signals of measurement values of the digital multimeter, and converts the high and low level signals into codes which the sound chip can recognize, and transmits the codes to the sound chip;
   wherein the sound chip converts the codes into audio frequency analog signals and transmits the audio frequency analog signals to the signal amplifying circuit; and
   wherein the signal amplifying circuit amplifies the audio frequency analog signals and outputs the amplified audio frequency analog signals to the speaker, and the amplified audio frequency analog signals drive the speaker to report the measurement values of the digital multimeter.

2. The digital multimeter of claim 1, wherein the single chip processor comprises a first parallel input/output port for collecting the high and low level signals of measurement values of the digital multimeter.

3. The digital multimeter of claim 1, wherein the sound chip comprises a plurality of Data pins, the single chip processor further comprising a second parallel input/output port, the plurality of Data pins connecting the second parallel input/output port to receive the codes from the single chip processor.

4. The digital multimeter of claim 1, wherein the signal amplifying circuit comprises a operational amplifier, the operational amplifier comprising a non-inverting input, an inverting input and an output, the non-inverting input of the operational amplifier connecting the sound chip, the inverting input of the operational amplifier connecting ground, the output of the operational amplifier connecting the speaker.

5. The digital multimeter of claim 3, further comprising an interface for connecting an earphone, the interface for connecting an earphone connecting the sound chip.

6. The digital multimeter of claim 3, further comprising a first voltage converting circuit for converting the voltage of the battery into a working voltage of the single chip processor.

7. The digital multimeter of claim 6, further comprising a second voltage converting circuit for converting the voltage of the battery into a working voltage of the sound chip.

8. The digital multimeter of claim 1, wherein a first pin of the single chip processor connects the first direct current power source, a fifth resistor being connected between the first direct current power source and a second pin of the single chip processor, a button being connected between the first direct current power source and a third pin of the single chip processor, a fifth capacitor and a sixth resistor being connected in series between ground and the first direct current power source, a crystal oscillator being connected between a fourth pin of the single chip processor and a fifth pin of the single chip processor, one end of a sixth capacitor and one end of a seventh capacitor being connected to the two ends of the crystal oscillator, the other end of the sixth capacitor and the other end of the seventh capacitor being connected to ground.

9. The digital multimeter of claim 4, wherein a fifth capacitor and a fifth resistor are connected in series and are connected between the non-inverting input of the operational amplifier and a third pin of the sound chip, a sixth resistor being connected between the inverting input of the operational amplifier and ground, a seventh resistor being connected between the inverting input and the output of the operational amplifier, the output of the operational amplifier being connected to a first pin of the speaker, an eighth resistor being connected between a second pin of the speaker and ground.

10. The digital multimeter of claim 5, wherein one end of a fifth resistor is connected to a third pin of the sound chip, one end of a fifth capacitor being connected to ground, the fifth resistor and the fifth capacitor being connected in series, a third port being formed between the fifth resistor and the fifth capacitor, one end of a sixth resistor being connected to a fourth pin of the sound chip, one end of a sixth capacitor being connected to ground, the sixth resistor and the sixth capacitor being connected in series, a fourth port being formed between the sixth resistor and the sixth capacitor, the first port and the second port cooperatively forming the interface for connecting an earphone.

11. The digital multimeter of claim 6, wherein the first voltage converting circuit comprises a converting chip, a first pin of the converting chip being connected to the battery, a fifth capacitor and a sixth capacitor being connected in parallel and connected between the battery and ground, fifth and sixth resistors being connected in series and connected between the battery and ground, a second pin of the converting chip being connected between the fifth and sixth resistors, a seventh capacitor being connected between a third pin of the converting chip and ground, seventh and eighth resistors being connected in series and connected between the first direct current power source and ground, a fourth pin of the converting chip being connected between the seventh and eighth resistors, an eighth capacitor being connected between a fifth pin of the converting chip and ground, a ninth capacitor and a ninth resistor being connected in series and connected between the fifth pin of the converting chip and ground, a sixth pin of the converting chip being connected to ground, an inductance being connected between a seventh pin of the converting chip and the first direct current power source, the inductance and a tenth capacitor being connected in series and connected between an eighth pin of the converting chip and the first direct current power source, the inductance and a Schottky diode being connected in series and connected between the first direct current power source and ground, eleventh and twelfth capacitors being connected in parallel and connected between the first direct current power source and ground.

12. The digital multimeter of claim 7, wherein in the second voltage converting circuit, fifth and sixth resistors are connected in series and connected between the battery and ground, a non-inverting input of an operational amplifier being connected between the fifth and sixth resistors, a fifth capacitor being connected between the non-inverting input of the operational amplifier and ground, a gate electrode of a MOSFET being connected to an output of the operational amplifier, a drain electrode of the MOSFET being connected to the first direct current power source, a sixth capacitor and a seventh resistor being connected in series and connected between an inverting input of the operational amplifier and the output of the operational amplifier, an eighth resistor being connected between the gate electrode and a source electrode of the MOSFET, a ninth resistor being connected between the inverting input of the operational amplifier and the source electrode of the MOSFET, the source electrode of the MOSFET being connected to a second direct current power source, a seventh capacitor being connected between the second direct current power source and ground.

* * * * *